United States Patent
Owen et al.

(10) Patent No.: US 10,620,142 B2
(45) Date of Patent: Apr. 14, 2020

(54) X-RAY SPECTROSCOPY IN A CHARGED-PARTICLE MICROSCOPE

(71) Applicant: FEI Company, Hillsboro, OR (US)

(72) Inventors: Michael James Owen, Queensland (AU); Ashley Donaldson, Queensland (AU)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/173,175

(22) Filed: Oct. 29, 2018

(65) Prior Publication Data
US 2019/0172681 A1  Jun. 6, 2019

(30) Foreign Application Priority Data
Oct. 30, 2017  (EP) .................... 17199115

(51) Int. Cl.
*H01J 37/32*  (2006.01)
*G01N 23/223*  (2006.01)
(Continued)

(52) U.S. Cl.
CPC ....... *G01N 23/2252* (2013.01); *G01N 23/223* (2013.01); *H01J 37/261* (2013.01);
(Continued)

(58) Field of Classification Search
None
See application file for complete search history.

(56) References Cited

U.S. PATENT DOCUMENTS

2006/0291619 A1* 12/2006 Statham .................. G01N 23/22
378/45
2008/0111072 A1* 5/2008 Takakura ........... G01N 23/2252
250/310
(Continued)

FOREIGN PATENT DOCUMENTS

| EP | 1736759 A1 | 12/2006 |
|---|---|---|
| JP | S63313043 A | 12/1988 |
| JP | H0484743 A | 3/1992 |

OTHER PUBLICATIONS

D. Varentsov, et al, First Biological Images with High-Energy Proton Microscopy, Physica Medica, Jan. 19, 2012, pp. 208-213, Elsevier Ltd.

(Continued)

*Primary Examiner* — Michael J Logie

(57) ABSTRACT

A method of operating a charged particle microscope comprising:
  Providing a specimen on a specimen holder;
  Using a source to produce a beam of charged particles, and irradiating the specimen with said beam;
  Using a detector to detect X-ray radiation emanating from the specimen in response to said irradiation, and to produce a spectrum comprising X-ray characteristic peaks on a Bremsstrahlung background,
comprising the following additional steps:
  Using an elemental decomposition algorithm to analyze the characteristic peaks in said spectrum, thereby determining a reference group of major chemical elements contributing to the spectrum;
  Calculating an average atomic number for said reference group, and using this in a predictive model to generate a calculated Bremsstrahlung profile for the reference group;
  Fitting said calculated Bremsstrahlung profile to the Bremsstrahlung background in said spectrum, and attributing a discrepancy between the latter and the former to a residual element absent from, or incorrectly quantified in, said reference group.

17 Claims, 5 Drawing Sheets

(51) Int. Cl.
  *G01N 23/2252* (2018.01)
  *H01J 37/26* (2006.01)
(52) U.S. Cl.
  CPC .... *H01J 37/3233* (2013.01); *G01N 2223/402* (2013.01); *H01J 2237/22* (2013.01); *H01J 2237/2445* (2013.01)

(56) References Cited

U.S. PATENT DOCUMENTS

2010/0310035 A1* 12/2010 Proksa ................ A61B 6/032
                                                            378/4
2017/0067838 A1*  3/2017 Anan ................. G01N 23/2252

OTHER PUBLICATIONS

Ashok N. Srivastava, et al, Algorithms for Spectral Decomposition With Applications to Optical Plume Anomaly Detection, NASA Ames Research Center, Moffett Field, CA, Joint Army Navy NASA Air Force Conference on Propulsion Systems, 2008, pp. 1-12.
W. H. Escovitz, et al., Scanning Transmission Ion Microscope with a Field Ion Source, Proc. Nat. Acad. Sci. USA, May 1975, pp. 1826-1828, vol. 72, No. 5, The Enrico Fermi Institute and Department of Physics, The University of Chicago.

* cited by examiner

X-RAY SPECTROSCOPY IN A CHARGED-PARTICLE MICROSCOPE

FIELD OF THE INVENTION

The invention relates to a method of operating a charged particle microscope comprising:
- Providing a specimen on a specimen holder;
- Using a source to produce a beam of charged particles, and irradiating the specimen with said beam;
- Using a detector to detect X-ray radiation emanating from the specimen in response to said irradiation, and to produce a spectrum comprising X-ray characteristic peaks on a Bremsstrahlung background.

The invention also relates to a charged particle microscope in which such a method can be performed.

BACKGROUND OF THE INVENTION

Charged-particle microscopy is a well-known and increasingly important technique for imaging microscopic objects, particularly in the form of electron microscopy. Historically, the basic genus of electron microscope has undergone evolution into a number of well-known apparatus species, such as the Scanning Electron Microscope (SEM), Transmission Electron Microscope (TEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes (for example).
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:
- A particle source, such as a Schottky electron source or ion source.
- An illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder will comprise means for maintaining said specimen at cryogenic temperatures, e.g. using an appropriately connected cryogen vat.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors (SDD) and Si(Li) detectors), etc. In general, a CPM may comprise several different types of detector, selections of which can be invoked in different situations.

In the particular case of a dual-beam microscope, there will be (at least) two sources/illuminators (particle-optical columns), for producing two different species of charged particle. Commonly, an electron column (arranged vertically) will be used to image the specimen, and an ion column (arranged at an angle) can be used to (concurrently) modify (machine/process) and/or image the specimen, whereby the specimen holder can be positioned in multiple degrees of freedom so as to suitably "present" a surface of the specimen to the employed electron/ion beams.

In the case of a transmission-type microscope (such as a (S)TEM, for example), a CPM will specifically comprise:
- An imaging system (imaging particle-optical column), which essentially takes charged particles that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

A particular application of a charged-particle microscope is in performing X-ray spectroscopy. An example of such spectroscopy is Energy-Dispersive X-ray Spectroscopy, which is often referred to using the acronyms EDX or EDS. In this technique, a specimen (e.g. a mineralogical or semiconductor sample) is bombarded with a focused input beam of electrons, e.g. in a SEM or (S)TEM. A lower-shell electron in an atom of the specimen can be ejected from its orbit by a collision with one of these bombarding electrons, creating an electron hole that is promptly filled by the de-excitation of a higher-shell electron in the atom in question, with the concurrent release of a quantum of energy in the form of an X-ray photon. The energy signature/distribution of photons emitted in this way will be characteristic of the particular electron shell structure of the atom in question, and can thus be used as a "fingerprint" in performing compositional analysis of the specimen. An energy-dispersive spectrometric detector collects, sorts and counts the different photons of different energies, producing a measured spectrum for the location of the specimen onto which the focused input beam was directed; such a spectrum can be rendered as a graph of counts per channel (ordinate) versus channel number (abscissa), corresponding to intensity versus energy, and generally comprising a Bremsstrahlung background and various characteristic peaks—whose energy can be used to identify the generating material (which may be an element, chemical compound or mineral, for example, and which may be amorphous or crystalline in nature, for example) and whose height can (in principle) be used to estimate relative quantity of the generating material. If desired, one can then (automatically) move the specimen and/or the beam so that the beam is directed onto a new location on the specimen, and (automatically) repeat the process described above at said new location. This technique is particularly useful in the field of mineralogy, in which a small specimen may contain many different kinds of minerals; however, its usefulness in fields such as metallurgy, microbiology and semiconductor science is also self-evident.

As here employed, the term EDX encompasses so-called Wavelength Dispersive X-Ray Spectroscopy (WDX or WDS). This latter technique can be regarded as a particular refinement of EDX in which the X-rays emerging from a specimen are filtered (e.g. with the aid of a particular type of crystal), so that only X-rays of a given wavelength are counted at any given time.

Another such spectroscopic technique is Proton-Induced X-Ray Emission (PIXE), in which the input beam comprises protons. PIXE can, for example, be performed in a proton microscope.

In what follows, the techniques disclosed herein may—by way of example—sometimes be set forth in the specific context of electron microscopy; however, such simplification is intended solely for clarity/illustrative purposes, and should not be interpreted as limiting.

A problem with known CPM-based X-ray spectroscopy techniques is that they cannot be satisfactorily used to detect relatively light chemical elements (or compounds) with "low" atomic numbers Z—typically below a threshold value $Z_o$ of 5 or 6. This group of "excluded elements" includes extremely important members such as:

Lithium (Z=3): Important in the manufacture of rechargeable batteries, engineering alloys, refractive materials and drugs. It does not occur as a metal in nature, but is found in a variety of minerals in igneous rocks.

Beryllium (Z=4): Used to manufacture engineering allows (particularly for the aviation industry), X-ray transmissive optical elements and neutron reflectors/moderators in nuclear reactors. Beryllium and its compounds are toxic and carcinogenic, so that it can be important to be able to detect trace quantities of them.

This shortcoming is inter alia attributable to the following:

The so-called "zero peak" (at/near zero spectral energy) tends to overwhelm the low-energy signals from low-Z elements.

Many X-ray detectors employ an X-ray window (e.g. comprised of Be), which tends to absorb low-energy X-rays from light elements. Such windows are, for example, used to prevent a cooled X-ray detector from becoming a cryo-trap in the vacuum environment of a CPM.

Some researchers claim to be able to reliably detect Boron (Z=5) using low-speed, low-kV acquisition; however, for "normal" (high-speed) acquisition, such detection is essentially impractical, in which case Boron is also often regarded as being a member of the aforementioned "excluded elements". Boron is used in the manufacture of medicaments and vitreous materials, and as a dopant in the semiconductor industry.

Another issue with known CPM-based X-ray spectroscopy techniques is that they have problems dealing with overlapping doublet lines—where a characteristic line of a first element overlaps with that of a second (or further) element, forming a convoluted hybrid feature that cannot be satisfactorily resolved. In such situations, it is challenging to try to quantify the proportions of each contributing element contributing to the overlapping doublet.

SUMMARY OF THE INVENTION

It is an object of the invention to address these issues. More specifically, it is an object of the invention to provide a CPM-based X-ray spectroscopic technique that allows detection/analysis of low-Z elements/constituents in a specimen under investigation. It is a further object of the invention that this new technique should provide a means of more accurately deciding the constitutional make-up of overlapping doublets.

These and other objects are achieved in a method as set forth in the opening paragraph above, characterized by:

Using an elemental decomposition algorithm to analyze the characteristic peaks in said spectrum, thereby determining a reference group of major chemical elements contributing to the spectrum;

Calculating an average atomic number for said reference group, and using this in a predictive model to generate a calculated Bremsstrahlung profile for the reference group;

Fitting said calculated Bremsstrahlung profile to the Bremsstrahlung background in said spectrum, and attributing a discrepancy between the latter and the former to a residual element absent from, or incorrectly quantified in, said reference group.

Charged particle (e.g. electron) scattering in X-ray targets is well understood, and various formulas/models have been derived that express Bremsstrahlung intensity as a function of atomic number, Z. Some such models are relatively advanced, e.g. because they need to take stock of relativistic effects—as in the case of X-ray production in bombarded gases in high energy astrophysics, for example. Others can afford to be simpler in form, e.g. when applied in a relatively low-energy regime. For example, the Bethe-Heitler model aims to give a thorough quantum mechanical description of Bremsstrahlung, resulting in a complex model.

In the present disclosure, such complexity is generally found to be unnecessary, and simpler models can suffice. In a specific embodiment of the present invention, the employed predictive model (used to generate the aforementioned calculated Bremsstrahlung profile) is selected from the group comprising Kramers' Law, the Seltzer-Berger model, and combinations hereof.

In an embodiment of the current disclosure, said residual element is a light (low-Z) element with an atomic number less than a threshold value $Z_o$=6, i.e. it is one of the aforementioned "excluded elements". In this context, the present invention is the first known enabler of direct low-Z compositional analysis in CPM-based X-ray spectroscopy. In principle, the invention only reveals an unspecified (potentially multi-element) residual spectral component, but there are many contextual circumstances that allow (quantitative) element-specific information to be obtained herefrom, since there are many "controlled" situations in which one can be reasonably confident that certain low-Z elements will be essentially absent, thus allowing a given result to be attributed entirely to a specific element that is expected to be present. For example:

- Demand for Lithium has increased enormously in recent years, due to use in rechargeable battery technology, but supply is relatively scarce, with commercially viable reserves being concentrated at just a few locations worldwide. The underlying problem is that Lithium can (currently) only be viably extracted from specific types of lakebed salts, and less viably from certain minerals and clays. Discovering new sources of Lithium typically requires CPM imaging of samples to examine mineral structure, with assistive molecular-scale spectroscopic analysis, e.g. using EDS. In the types of minerals (as opposed to brine salts) being investigated, the presence of elements such as Be and B is not typically expected—in which case the present invention can be regarded as yielding Li-specific results.
- Recent research has shown that one can obtain longer-lasting, more efficient and safer nuclear fuel by adding Beryllium oxide to currently employed Uranium oxide, e.g. using a co-sintering technique. However, significant research is still required to optimize the recipes and manufacturing techniques involved. In such investigations, the nature of the matter being studied means that the present invention can be regarded as yielding Be-specific results.
- Occupational exposure to Beryllium can cause cancer, and there are many studies to investigate how Be enters and affects mammalian cells, e.g. what specific sites of a DNA molecule play a particular role in Be toxicology. In such substance-specialized studies, the present invention can be regarded as yielding Be-specific results.
- When performing CPM-based quality control/optimization of semiconductor device structure, one can be relatively confident that certain elements will be absent from a device, by virtue of the strict conditions under which it is manufactured; on the other hand, the presence of other elements will be expected. A typical such instance is with Boron doping—whereby optimal doping will be highly region-specific and within tight concentration tolerances. In such investigations, the present invention can be regarded as yielding Boron-specific results.

In another embodiment of the present invention, said residual element has a characteristic peak that forms an overlapping doublet with a characteristic peak of an element in said reference group. Examples of such overlapping doublets include S—Mo, Ti—Ba, and W—Si, for instance. In such an embodiment, it is assumed that prior knowledge of the type of material under analysis will allow the element selection process to rule out undetectable light elements in advance (refer to previous embodiment)—in which case the measured Bremsstrahlung radiation profile should ideally match the predicted Bremsstrahlung profile. Any observed differences in Bremsstrahlung profile can be attributed to incorrect element selection/quantification for double (or triple) element peaks—in which case the element quantification process can be iterated until such discrepancy has been removed (or reduced below an acceptance threshold).

The skilled artisan will appreciate that the present invention can be applied in a TEM, STEM, SEM, FIB-SEM, and various other types of CPM.

BRIEF DESCRIPTION OF THE DRAWINGS

The invention will now be elucidated in more detail on the basis of exemplary embodiments and the accompanying schematic drawings, in which.

In the Figures, where pertinent, corresponding parts may be indicated using corresponding reference symbols.

DETAILED DESCRIPTION OF EMBODIMENTS

Embodiment 1

Figure 1:
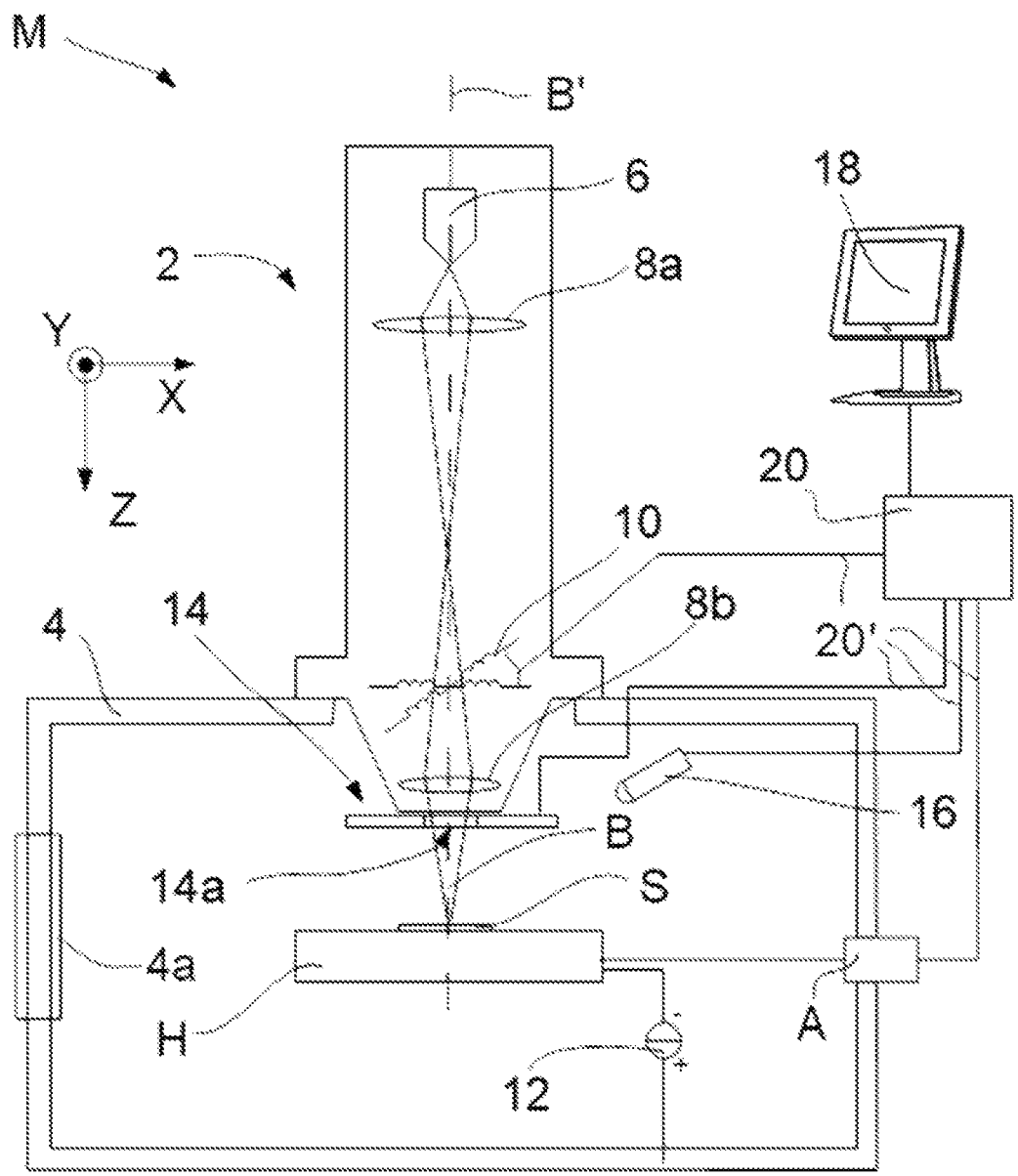
FIG. 1 renders a longitudinal cross-sectional view of an embodiment of a CPM in which the present invention is implemented.

FIG. 1 is a highly schematic depiction of an embodiment of a CPM M that can be used in conjunction with the present invention; more specifically, it shows an embodiment of a SEM, though, in the context of the present invention, it could alternatively be a TEM, or an ion-based microscope, for example. The microscope M comprises a particle-optical column/illuminator 2, which produces a beam B of charged particles (in this case, an electron beam) that propagates along a particle-optical axis B'. The particle-optical column 2 is mounted on a vacuum chamber 4, which comprises a specimen holder H and associated stage/actuator A for holding/positioning a specimen S. The vacuum chamber 4 is evacuated using vacuum pumps (not depicted). With the aid of voltage source 12, the specimen holder H, or at least the specimen S, may, if desired, be biased (floated) to an electrical potential with respect to ground.

The particle-optical column 2 comprises an electron source 6 (such as a Schottky emitter), (electrostatic/magnetic) lenses 8a, 8b (in general, more complex in structure than the schematic depiction here) to focus the electron beam B onto the specimen S, and a deflection unit 10 to perform beam deflection/scanning of the beam B. When the beam B impinges on/is scanned across the specimen S, it will precipitate emission of various types of "stimulated" radiation, such as backscattered electrons, secondary electrons, X-rays and cathodoluminescence (infra-red, visible and/or ultra-violet photons); one or more of these radiation types can then be sensed/recorded using one or more detectors, which may form an image, spectrum, diffractogram, etc., typically by assembling a "map" (or "matrix") of detector output as a function of scan position on the specimen. The present Figure shows two such detectors, 14, 16, which may, for example, be embodied as follows:

Detector 14 is a segmented electron detector, comprising a plurality of independent detection segments (e.g. quadrants) disposed about a central aperture 14a (allowing passage of the beam B). Such a detector can, for example, be used to investigate (the angular dependence of) a flux of output (secondary or backscattered) electrons emerging from the specimen S.

Detector 16 could, for example, be an electron detector (such as an Solid State Photo-Multiplier) or a light detector (such as a photodiode); however, in the present configuration, it is an X-ray detector, such as an SDD or Si(Li) sensor, for instance.

These are just examples, and the skilled artisan will understand that other detector types, numbers and geometries/configurations are possible.

The microscope M further comprises a controller/computer processing unit 20 for controlling inter alia the lenses 8a/8b, the deflection unit 10, and detectors 14, 16, and displaying information gathered from the detectors 14, 16 on a display unit 18 (such as a flat panel display); such control occurs via control lines (buses) 20'. The controller 20 (or another controller) can additionally be used to perform various mathematical processing, such as combining, integrating, subtracting, false colouring, edge enhancing, and other processing known to the skilled artisan. In addition, automated recognition processes (e.g. as used for particle analysis) may be included in such processing.

Also depicted is a vacuum port (load lock) 4a, which may be opened so as to introduce/remove items (components, specimens) to/from the interior of vacuum chamber 4, or onto which, for example, an ancillary device/module may be mounted (not depicted). A microscope M may comprise a plurality of such ports 4a, if desired.

Figure 2A:
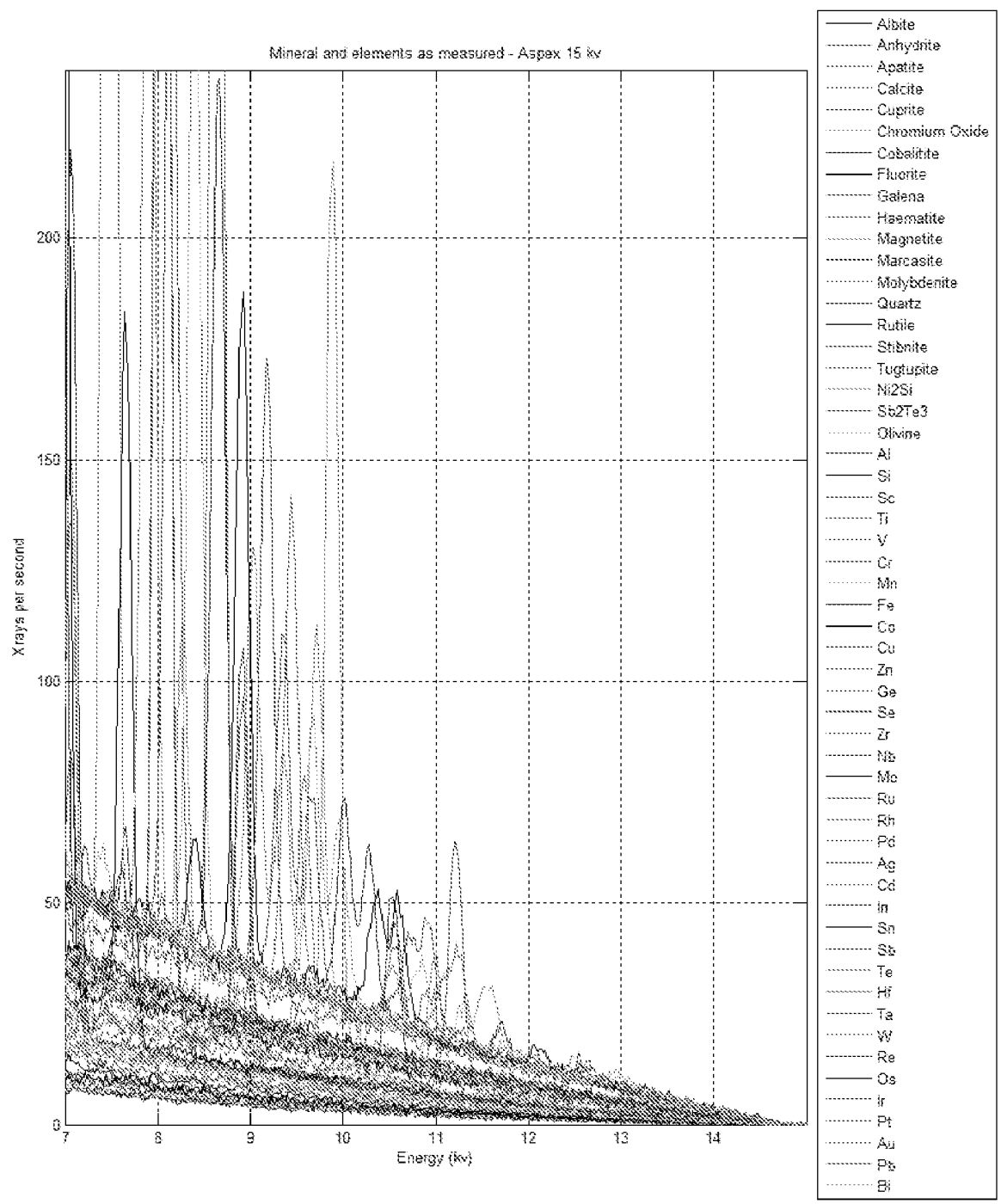
FIG. 2A shows several EDX spectra, acquired for a variety of elements and minerals.
Figure 2B:
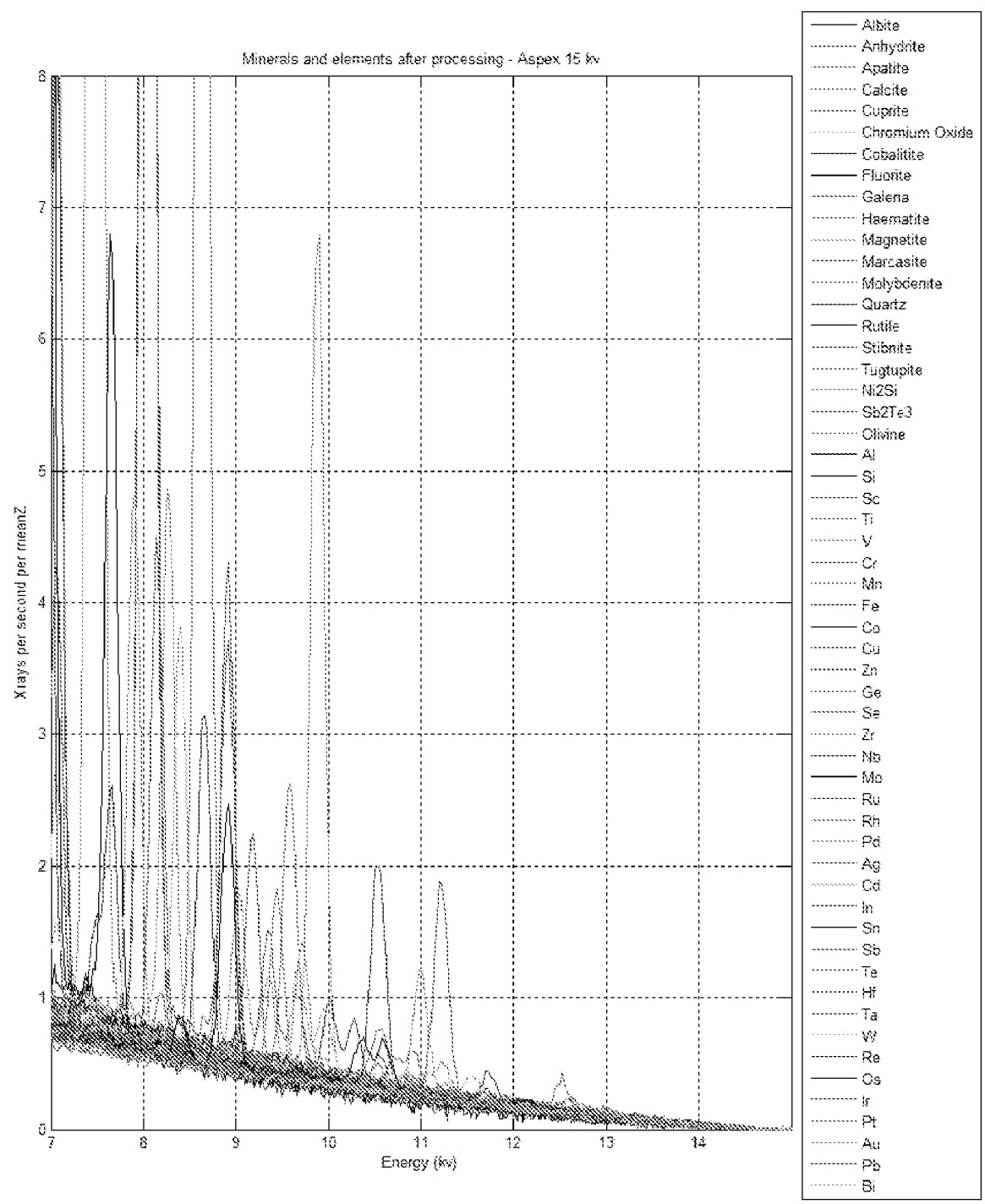
FIG. 2B corresponds to FIG. 2A, except that the various spectra have been scaled according to (mean) atomic number.
Figure 2C:
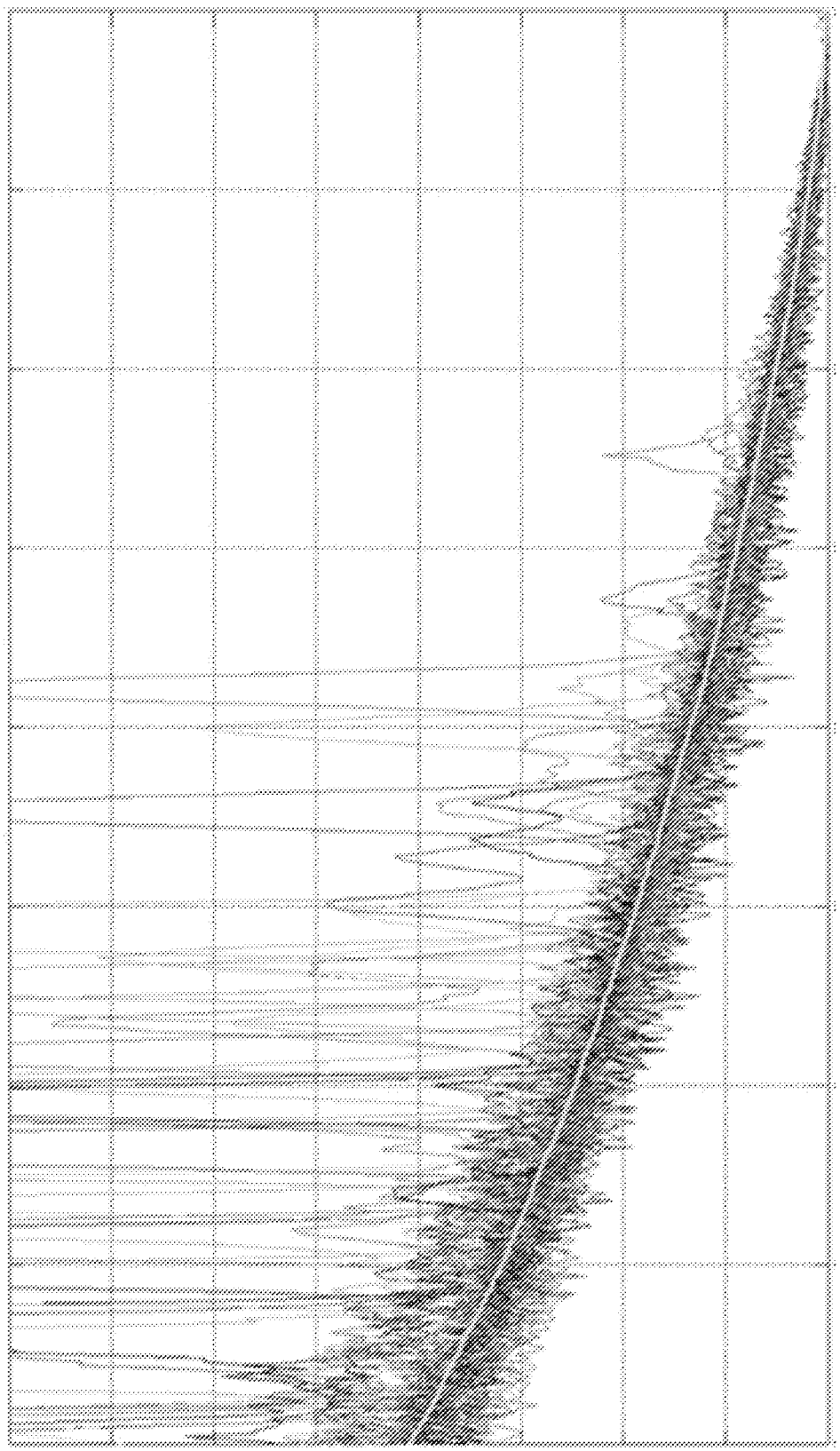
FIG. 2C shows a portion of FIG. 2B, now including a calculated/modelled generic Bremsstrahlung curve.

In the context of the current invention, X-ray detector 16 can be used to collect an EDX spectrum of a portion of specimen S on which beam B is impinging. FIG. 2A shows several such EDX spectra, acquired for a variety of elements and minerals (listed along the vertical axis on the right of the Figure), whereby the horizontal axis denotes energy in eV (from 7 eV upward) and the vertical axis shows number of detector counts per second. It is clear from the Figure that each such spectrum comprises characteristic peaks that sit atop a ridge/shoulder of Bremsstrahlung—the latter demonstrating a (quasi-)exponential fall-off in intensity as a function of increasing energy. Turning now to FIG. 2B, this corresponds to FIG. 2A, except that the various spectra have been scaled by (mean) atomic number of the element/mineral concerned—resulting in a significant convergence of the various Bremsstrahlung components. This illustrates one of the principles underlying the present invention, namely that (mean) atomic number is "encoded" into the Bremsstrahlung signature. This aspect is illustrated graphically in FIG. 2C, which shows a portion of FIG. 2B on which a calculated/modelled generic Bremsstrahlung curve (pale grey locus) has been overlaid.

Figure 3:
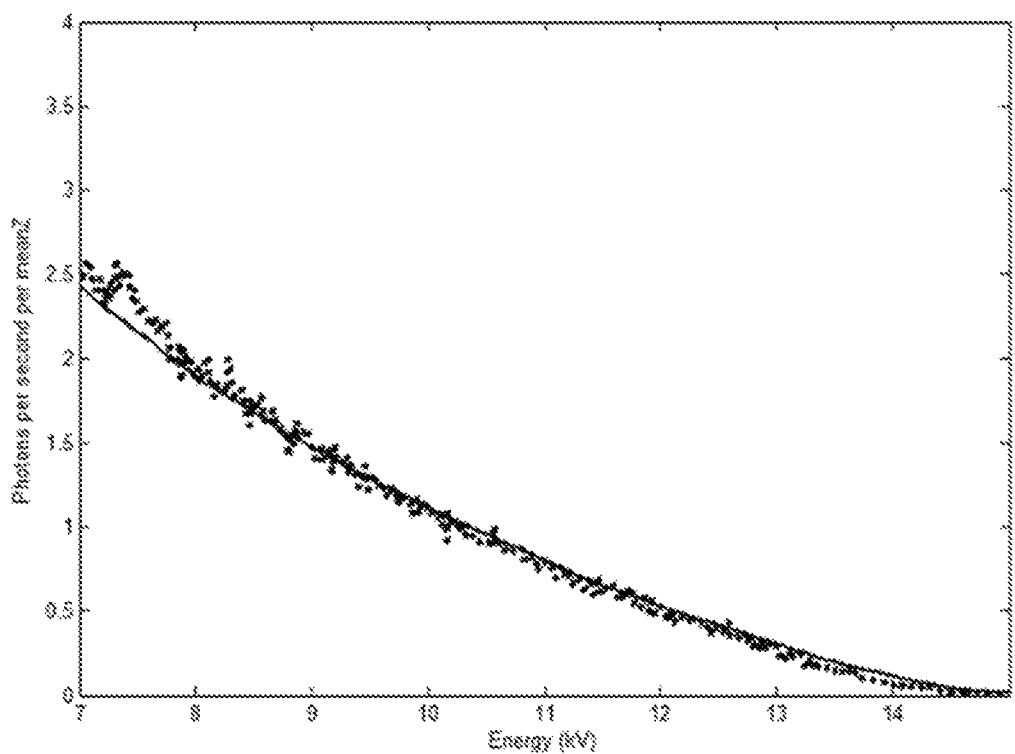
FIG. 3 shows a (partial) EDX spectrum for a calculated/modelled Bremsstrahlung profile, with a (partial) Gypsum spectrum fitted to this profile in order to compute an unknown hydrogen content in the gypsum.

Turning now to FIG. 3, this shows a partial EDX spectrum for a Gypsum sample. Gypsum has the composition $CaSO_4 \cdot nH_2O$, where $0 \leq n \leq 2$ is variable, depending on the degree of hydration of the gypsum sample concerned. For a given gypsum sample (n unknown), one can use the present invention to:

Acquire an EDX spectrum of the sample (the data points in FIG. 3);

Use the spectrum's characteristic peaks for the reference group of elements O, S and Ca to determine an average atomic number for the sample;

Use this average atomic number to generate a calculated Bremsstrahlung profile for the reference group (the solid black line in FIG. 3);

Compare/fit this calculated Bremsstrahlung profile to the observed Bremsstrahlung background in the spectrum and attribute a discrepancy/shortfall between the latter and the former to a "missing" residual element—which, in this case, must be hydrogen.

For a given test sample of gypsum, the inventors used this technique to obtain the following results:

| Element | Weight percentage |
|---------|-------------------|
| O | 49.620641 |
| S | 22.081401 |
| Ca | 27.598652 |
| H | 0.699306 |

This yields n=0.5037 (degree of hydration) in the formula $CaSO_4 \cdot nH_2O$.

The invention claimed is:

1. A method of operating a charged particle microscope comprising:
   irradiating a specimen with a beam of charged particles;
   detecting, using a detector, X-ray radiation emanating from the specimen in response to said irradiation;
   producing, based on the X-ray radiation, a spectrum comprising X-ray characteristic peaks on a Bremsstrahlung background;
   analyzing the characteristic peaks in said spectrum using an elemental decomposition-algorithm to determine a reference group of major chemical elements contributing to the spectrum;
   calculating an average atomic number for said reference group determined by analyzing the characteristic peaks in said spectrum;
   determining with a predictive model a calculated Bremsstrahlung profile for the reference group based on the average atomic number;
   fitting said calculated Bremsstrahlung profile to the Bremsstrahlung background in said spectrum; and
   attributing a discrepancy between the Bremsstrahlung profile and the Bremsstrahlung background to a residual element absent from, or incorrectly quantified in, said reference group.

2. A method according to claim 1, wherein said predictive model is selected from the group comprising Kramers' Law, the Seltzer-Berger model, and combinations hereof.

3. A method according to claim 1, wherein said residual element is a light element with an atomic number less than a threshold $Z_o=6$.

4. A method according to claim 3, wherein said discrepancy is attributed entirely to Hydrogen.

5. A method according to claim 1, wherein said residual element has a characteristic peak that forms an overlapping doublet with a characteristic peak of an element in said reference group.

6. A charged particle microscope comprising:
   a source, for producing a beam of charged particles, and directing the beam of charged particles onto said specimen;
   a detector for detecting X-ray radiation emanating from the specimen in response to said irradiation, and, in response, to produce a spectrum comprising X-ray characteristic peaks on a Bremsstrahlung background;
   a controller for controlling at least some operational aspects of the microscope,
   said controller configured to:
   analyze the characteristic peaks in said spectrum using an elemental decomposition algorithm;

determine, based on the characteristic peaks in said spectrum, a reference group of major chemical elements contributing to the spectrum;

calculate an average atomic number for said reference group;

generate, with a predictive model, a calculated Bremsstrahlung profile for the reference group;

fit said calculated Bremsstrahlung profile to the Bremsstrahlung background in said spectrum and attribute a discrepancy between the Bremsstrahlung profile and the Bremsstrahlung background to a residual element absent from, or incorrectly quantified in, said reference group.

7. The charged particle microscope of claim 6, wherein said predictive model is selected from the group comprising Kramers' Law, the Seltzer-Berger model, and combinations hereof.

8. The charged particle microscope of claim 6, wherein said residual element is a light element with an atomic number less than a threshold $Z_o=6$.

9. The charged particle microscope of claim 8, wherein said discrepancy is attributed entirely to Hydrogen.

10. The charged particle microscope of claim 6, wherein said residual element has a characteristic peak that forms an overlapping doublet with a characteristic peak of an element in said reference group.

11. A method comprising:

acquiring an x-ray spectrum of a sample, the spectrum at least including characteristic peaks of a reference group of elements forming the sample and a Bremsstrahlung background;

based on the x-ray spectrum, determining an average atomic number of the reference group of elements;

based on the average atomic number, determining a Bremsstrahlung profile for the reference group of elements;

comparing the Bremsstrahlung profile to the Bremsstrahlung background to determine a difference; and based on the difference, determine whether a residual element is absent from or incorrectly quantified in the reference group of elements.

12. The method of claim 11, wherein determining a Bremsstrahlung profile for the reference group of elements includes based on a predictive model, calculating the Bremsstrahlung profile for the reference group of elements.

13. The method of claim 12, wherein the predictive model is selected from one of comprising Kramers' Law, the Seltzer-Berger model, and combinations thereof.

14. The method of claim 11, wherein determining an average atomic number of the reference group of elements includes based on an elemental decomposition algorithm, analyzing peaks in the x-ray spectrum to determine elements contributing to the spectrum, the determined elements being the reference group of elements.

15. The method of claim 11, wherein the residual element is a low atomic number element.

16. The method of claim 11, wherein the low atomic number element is any element having an atomic number of six or less.

17. The method of claim 11, further including based on the determination of a residual element being absent from or incorrectly identified in the reference group elements, the steps of the method are iterated with the determined residual element included with the reference group of elements.

* * * * *